United States Patent [19]

Baum et al.

[11] Patent Number: 4,601,018

[45] Date of Patent: Jul. 15, 1986

[54] BANKED MEMORY CIRCUIT

[76] Inventors: Allen Baum, 2310 Cornell St., Palo Alto, Calif. 94306; Peter Baum, 21907 Almaden Ave., Cupertino, Calif. 95014

[21] Appl. No.: 696,038

[22] Filed: Jan. 29, 1985

[51] Int. Cl.[4] .............................................. G11C 11/30
[52] U.S. Cl. .................................... 365/189; 365/230; 365/222; 365/200
[58] Field of Search ................ 365/189, 222, 200, 230

[56] References Cited

U.S. PATENT DOCUMENTS

| 4,332,008 | 5/1982 | Shima et al. | 365/222 |
| 4,333,167 | 6/1982 | McElroy | 365/222 |
| 4,387,423 | 6/1983 | King et al. | 365/222 |

*Primary Examiner*—Terrell W. Fears

[57] ABSTRACT

A memory circuit for interconnection to a computer including several memory banks, each bank including memory for the storage of information for the total address space addressable by the data processor. The memory circuit further includes a bank selection circuit connected to the data processor for receiving data representing a selected one of the memory banks. The memory circuit further includes a memory access circuit that determines from the bank selection circuit which one of the memory banks has been selected and provides alternating access between the selected memory bank and a specific memory bank in accordance with a timing signal from the data processor. The specific data bank includes display information and is accessed by the data processor during each interval when information is being output to the display. The memory circuit further includes a memory refresh circuit to refresh the memory banks by refreshing a limited number of memory banks during successive refresh time intervals in accordance with control signals from the display circuitry.

20 Claims, 7 Drawing Figures

BANKED MEMORY CIRCUIT

BACKGROUND

1. Field of the Invention

This invention relates generally to data processing systems and more specifically to memory circuits for data processing systems.

2. Description of the Prior Art

Data processing systems or computers use memory to store information. Specifically, the processor stores individual units of information (consisting of a specific number of bits or binary digits) at memory locations that are specified by addresses where the address itself consists of a specific number of bits. The total number of bits available for address information defines the magnitude or total number of memory locations that can be addressed. The total number of addressable memory locations is referred to as the data processor address space. This address space provides a limit to the amount of information that may be stored and accessed by the data processor. This memory limitation, in turn, limits the capability of the data processor in performing data processing functions.

Recently, the use of microprocessors has increased because of the convenience and economics of microprocessor integrated circuits in general. However, some microprocessors are limited because of the number of address lines available at the intergrated circuit interface and are therefore limited in the usable memory capacity. Several schemes have been used to increase the memory capability for microprocessors and other data processing systems. Such memory expansion techniques as virtual memory addressing and certain memory management techniques effectively add numbers of address lines available to the microprocessor by providing or dedicating external storage to store additional address information to permit access to a larger address space.

The Apple IIe computer has proven to be extremely popular. The Apple IIe computer includes a 6502 microprocessor which further includes a 16 bit address space. Therefore, the total amount of memory addressable by the 6502 microprocessor is 65,536 memory locations or bytes (hereinafter referred to as 64K). The 64K memory limitation in turn limits the capability of the Apple IIe to perform certain data processing functions. It has therefore become advantageous to increase the amount of memory available to the Apple IIe computer, or more specifically, available to the 6502 microprocessor. One embodiment of a memory extension scheme for the Apple IIe is the 80 column text card. This card is inserted in an auxiliary slot of the Apple IIe and provides additional memory to extend the text display of the Apple IIe from 40 columns to 80 columns. This extender card includes 64K of random access memory (RAM).

FIG. 1 illustrates the memory map for the Apple IIe which includes the memory addresses in hexadecimal (hereinafter hex). In the 40 column mode, the Apple IIe requires 1K bytes of memory for the storage of display information. By using the 80 column text card, which is illustrated as the auxiliary RAM in FIG. 1, the Apple IIe can display 80 column. The implementation for the Apple IIe to display 80 columns requires that 1K byte of the auxiliary RAM be included. The memory map of FIG. 1, together with the operation of the Apple IIe is detailed in the *Apple II Reference Manual* published by Apple Computer and herein incorporated by reference.

The memory map of FIG. 1 further includes a bank switched RAM at hex location $C000_{16}$ to $FFFF_{16}$ which is activated using certain software switches within the Apple II computer. This additional memory in both the main RAM and the auxiliary RAM is referred to commonly as bank switched RAM. However, the bank switching only refers to the 4K of addressable memory space starting at $D000_{16}$ for the 6502 microprocessor.

While the extended memory card provides the additional 64K of memory for both text display and graphics display, even more memory is often required for more complex data processing functions. While additional memory may be connected to the address and data base buses of the Apple IIe, problems occur during the display of information in the 80 column text mode or the high resolution graphics mode since the additional memory contained in the auxiliary RAM of FIG. 1 is required to store information for display. If additional memory is used, certain convoluted software techniques can be used to prevent display distortion. Another technique is to store the display data for the text display and/or the high resolution display in each of the additional memory areas. Needless to say the storage of redundant data in every memory bank is a waste of the time required to store this data and is also a waste of the valuable memory resource.

Therefore, providing additional memory for the Apple IIe while still including sufficient storage for the display requirements is still a problem.

It is an object of the present invention to provide additional memory for the computer while providing for special requirements for memory by computer peripheral devices.

SUMMARY OF THE INVENTION

In accordance with the present invention a memory circuit for innerconnection with a data processing computer is provided that includes several memory banks where each memory bank includes memory circuits for the storage of information for the computer. A bank selection circuit is included that is connected to the computer for receiving data that represents which one of the memory banks has been selected. A memory access circuit is provided for accessing the selected one of the memory bank or a specific memory bank in accordance with the timing signal from the computer.

In one embodiment, a memory circuit is provided that includes the several memory banks and the bank selection circuit with the memory access circuit including circuitry for alternating computer access between the selected memory bank and a specific memory bank in accordance with a timing signal from the computer. In this embodiment, the timing signal indicates an access of the memory by either the central processing unit or the video display circuit. In this embodiment, a specific memory bank is dedicated to include the display information required by the data processing system. This frees all of the other banks of memory for the general storage of data information. By hardware switching the specific memory bank during the display access, no display distortion occurs. Furthermore, the switching is transparent to the central processing unit since the central processing unit does not access the memory during the display access interval.

Another aspect of this embodiment includes the memory refresh signal required to maintain the storage of data in the memory circuits. In this embodiment, the meory circuits include individual memory integrated circuits that require refresh signals for maintaining their data. Since there are several memory banks, the refresh power requirement for refreshing all memory banks simultaneously would could generate a large power surge resulting in possible electromagnetic interference problems together with excessive power service requirements. This embodiment reduces the power requirements by providing refresh signals only when required and only to a subset of memory banks. In other words, all memory banks are refreshed at different times. The memory refresh circuit is connected to the display circuit and uses outputs of the display circuit to determine when memory refresh is required and which banks of memory are to be refreshed.

BRIEF DESCRIPTION OF THE DRAWINGS

The novel features believed characteristic of the invention are set forth in the appended claims. The invention itself, however, as well as other features therefore will be best understood by reference to the detailed description which follows when read in conjunction with the accompanying drawings, wherein:

DESCRIPTION OF THE PREFERRED EMBODIMENT

Figure 1:
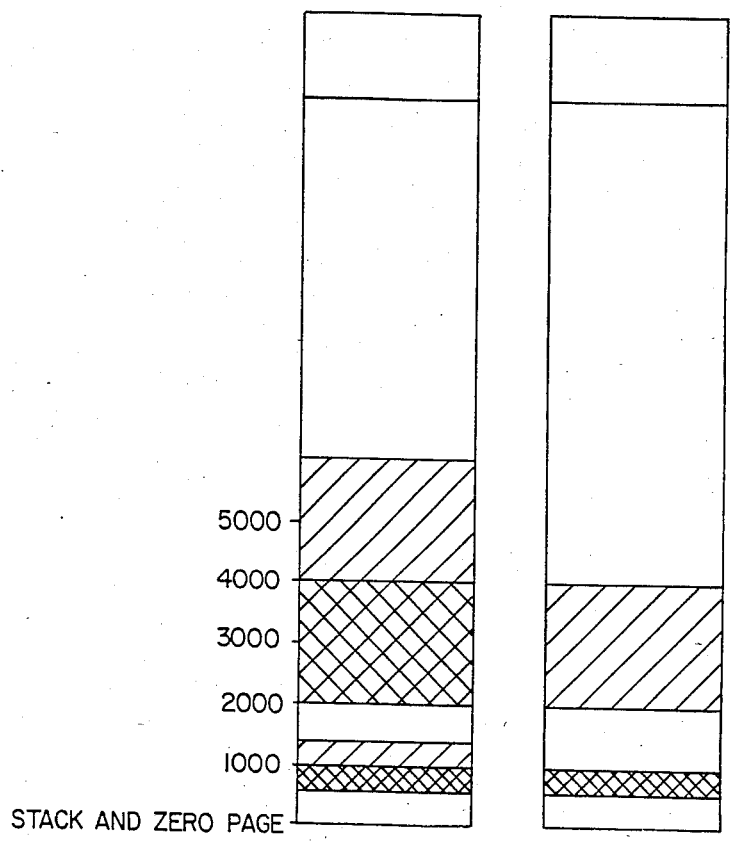
FIG. 1 is an illustration of the memory map of a computer containing both a main memory and an auxiliary memory.

As previously discussed, this invention relates to adding memory to a computer system and more specifically to an Apple IIe computer. The memory map for an Aple IIe is illustrated in FIG. 1. This memory map further includes the prior art attempt at memory expansion for the Apple IIe, namely the auxiliary RAM. As previously discussed, the auxiliary RAM includes 64K of memory that is connected in an auxiliary slot in the Apple IIe computer which connects this auxiliary RAM to the address data and control lines of the Apple IIe computer. This auxiliary memory provides extra memory for the text display in an 80 column display mode and further provides the additional memory to store information for the high resolution graphics display. The auxiliary RAM together with the main RAM includes 4K of addressable memory referred to as bank switched RAM which may be accessed using instructions and software switches outlined in the *Apple II Reference Manual*. For the purposes of clarity, this bank switched RAM will be considered to be a part of the remaining RAM when referring to the computer address space of hex $0000_{16}$ to $FFFF_{16}$.

Figure 2:
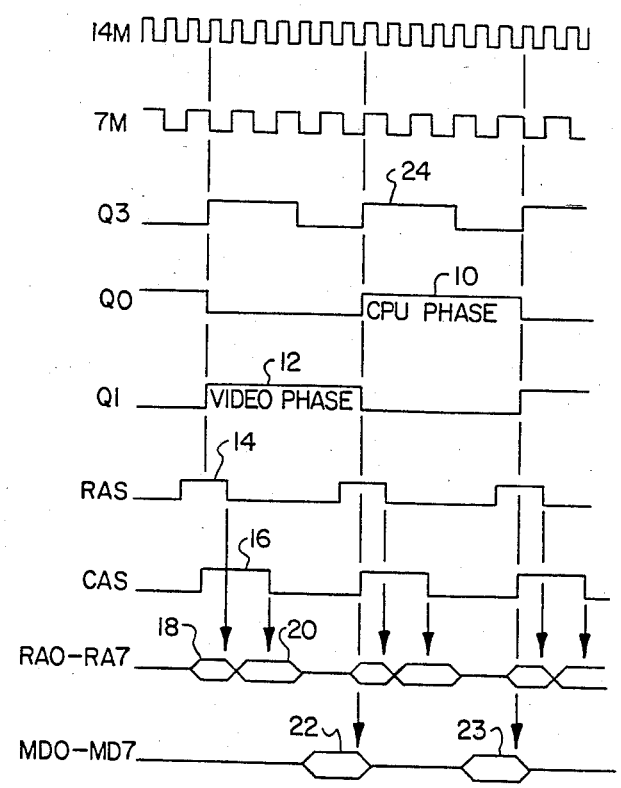
FIG. 2 is a timing diagram for the computer.

The timing for the Apple IIe computer is illustrated in FIG. 2. Specifically, the oscillator operates at approximately 14 megahertz producing a waveform as shown that is divided in half to provide the 7 megahertz waveform. Three basic clock signals are used by the memory circuit connected to the auxiliary slot of the Apple Bus system: Q0, Q1 and Q3. In addition, FIG. 2 illustrates the RAS (ROW ADDRESS STROBE) and CAS (COLUMN ADDRESS STROBE) signals that are used to access memory. In the preferred embodiment, the RAM integrated circuits used are dynamic RAM (DRAM) that require a refresh signal to maintain the integrity of data stored. In this embodiment, the data that is input or output from the DRAM is contained on the Data Bus MD0-MD7. The 16 bit address is input as two 8 bit bytes multiplexed on the Address bus RA0-RA7. As is shown in FIG. 2, the falling edge of the RAS pulse 14 is used to designate the row address 18 and the falling edge of the CAS pulse 16 is used to indicate the presence of the column address 20. Therefore the address lines are multiplexed in accordance with the RAS and CAS pulses as shown. The presence of data on the Data Bus is indicated by a rise in Q3 as pulse 24. Q0 and specifically pulse 10 is the time interval during which the central processing unit of the 6502 microprocessor accesses memory. In other words, data for the central processing unit (CPU) is accessed as illustrated by the interval 23 from the Data Bus MD0-MD7. Q1 and more specifically pulse 12, illustrates the phase in which the video display accesses the memory to obtain graphics data or text represented by interval 23 from the Data Bus MD0-MD7.

Referring to FIG. 1, it is important to understand that during the video phase of Q1, the computer is accessing the information from the memory dedicated to the display circuitry. Whereas, during the CPU phase 10, the computer is accessing any information within memory, which may include that information for the display. Therefore, the integrity of the display information stored in the auxiliary RAM must be maintained in order to prevent any distorted displays.

The present invention provides dedicated storage for the display information while at the same time providing up to 15 additional memory banks that do not contain locations dedicated to the display requirements of the Apple II computer.

Figure 3:
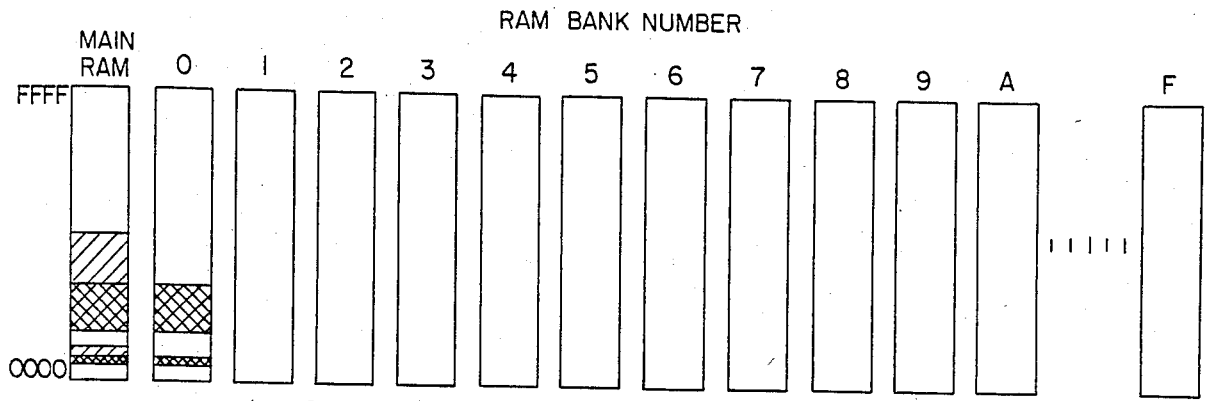
FIG. 3 is an illustration of the multiple memory bank configuration of the invention.

FIG. 3 illustrates the memory map for the Applicant's invention together with the memory map for the main RAM which is merely a reflection of the main RAM in FIG. 1. Specifically, the main RAM consists of the 64K within the Apple II computer and the Applicant's invention provides additonal memory banks which in this embodiment include 256K DRAMS, providing 16 memory banks, numbered hex $0-F_6$. Memory bank 0 provides the storage of the auxiliary RAM of FIG. 1. The remaining 15 memory banks do not contain any locations specifically dedicated to the displays circuitry and therefore can be totally dedicated to data processing functions of the CPU.

It is important to realize the providing these additional memory banks for the total CPU address space is not, alone, possible without causing display distortion. However, the interface circuitry of the invention prevents any such distortion. It is also important to realize that the additional 16 memory banks can result in an excessive power load on the computer power supply system. The computer was designed to interface to a single 64K main memory and a 64K auxiliary memory. The interface of the display circuitry and the power management of the memory banks provided by the Applicant's invention result in a memory extension system that is compatible and easily interfaced to the existing computer.

Figure 4:
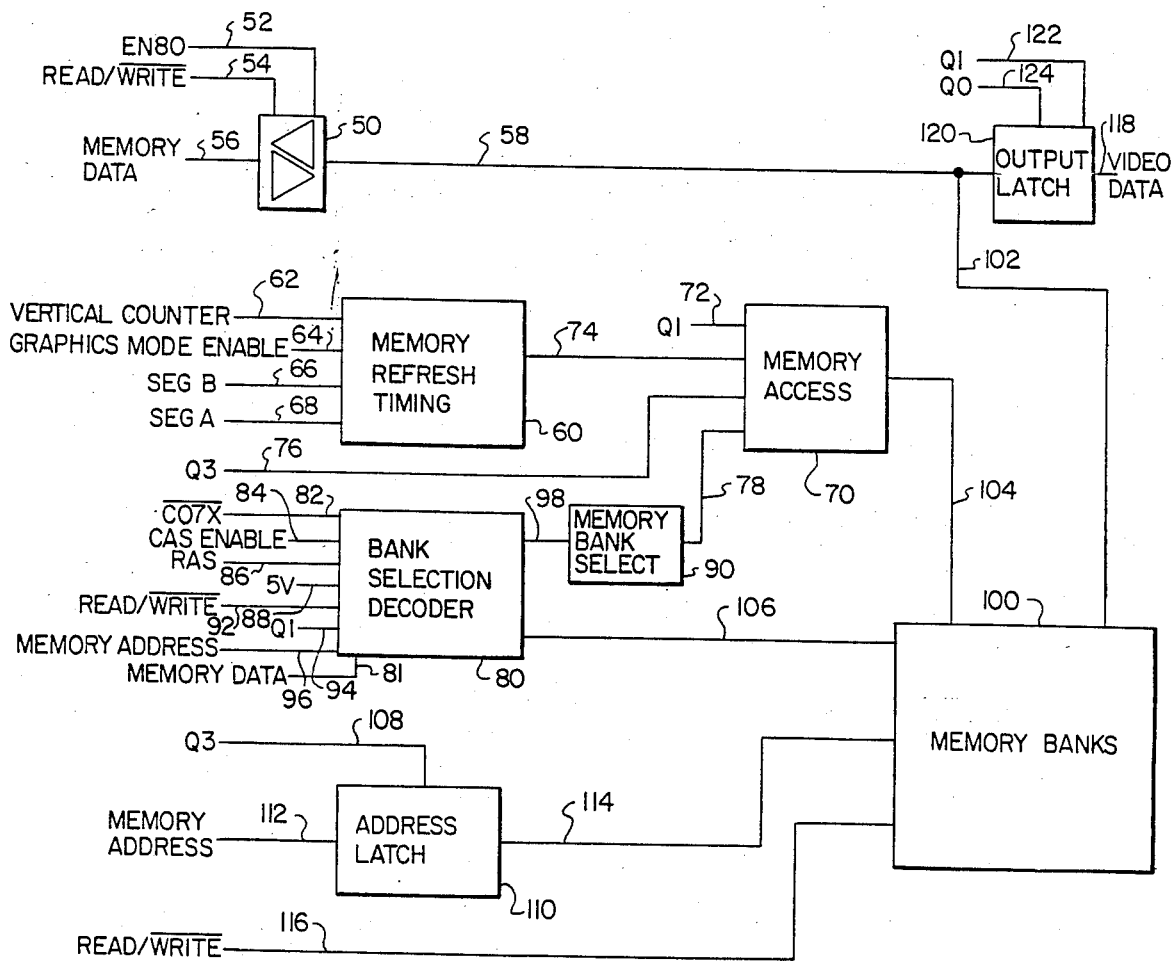
FIG. 4 is a block diagram of the memory circuit invention.

FIG. 4 is a block diagram of the Applicant's memory invention. The invention is specifically design to interface to the auxiliary slot in the Apple II computer. The operation of the computer with the Applicant's invention includes the use of the software switches provided in the Apple IIe. Table 1 lists the software switches and their location.

SOFT SWITCH TABLE

| NAME | IF | FUNCTION THEN | LOCATION DECIMAL | HEX | NOTES |
|---|---|---|---|---|---|
| RAMRD | On | Read Aux. 48K | 49155 | $C003 | Write |
|  | Off | Read Main 48K | 49154 | $C002 | Write |
|  | Read | RAMRD Switch | 49171 | $C013 | Read |
| RAMWRT | On | Write Aux. 48K | 49157 | $C005 | Write |
|  | Off | Write Main 48K | 49156 | $C004 | Write |
|  | Read | RAMWRT Switch | 49172 | $C014 | Read |
| ALTZP | On | Aux. Stack, Zero Page, and Bank-Switched Memory | 49161 | $C009 | Write |
|  | Off | Main Stack, Zero Page, and Bank-Switched Memory | 49160 | $C008 | Write |
|  | Read | ALTZP Switch | 49174 | $C016 | Read |
| 80STORE | On | Access Page 1X | 49153 | $C001 | Write |
|  | Off | Use RAMRD, RAMWRT | 49152 | $C000 | Write |
|  | Read | 80STORE Switch | 49176 | $C018 | Read |
| PAGE2 | On | Access Aux. Memory | 49237 | $C055 | 1, Write |
|  | Off | Access Main Memory | 49236 | $C054 | 1, Write |
|  | Read | PAGE2 Switch | 49180 | $C01C | Read |
| HIRES | On | Access High-Resolution Page 1X | 49239 | $C057 | 2, Write |
|  | Off | Use RAMRD, RAMWRT | 49238 | $C056 | 2, Write |
|  | Read | HIRES Switch | 49181 | $C01D | Read |

These software switches used in conjunction with the programs provide the Apple IIe computer with the capability to utilize the extended memory capability of the Applicant's invention.

In FIG. 4, the memory bank 100 includes a plurality of data lines 102 and a plurality of address lines 114. The address lines 114 provide the address information which enables the input to output of data information over the data lines 102. Reading and writing of the memory back 100 is designated by the READ/WRITE80 signal on line 16. As previously discussed, the data output from the memory bank 100 is rovided to the CPU and to the display. In FIG. 4 data lines 102 are connected to a plurality of lines 58 which on one side are connected to an output register 120 providing output information on lines 118 to the display (i.e. video data to the display). Additionally, lines 58 are connected by directional drivers 50 providing the input and output of data from lines 56 to the CPU. The READ/WRITE- signal on line 54 controls the direction of the bidirectional drivers 50 with the ENABLE80 signal on line 52 enabling the operation of the bidirectional drivers 50.

The output register 120 for the display information includes signal lines 124 and 122 which provide Q0 and Q1 TIMING signals respectively from the computer. Q0 and Q1 (see FIG. 2) provide the TIMING signals that indicate when the CPU is accessing the data of the memory via lines 56 or when the display circuitry is accessing the memory data via lines 118. Therefore, Q0 and Q1 control the output latching of data to the display circuitry in accordance with the timing diagram of FIG. 2.

Memory bank 100 in the block diagram of FIG. 4 may contain up to 16 memory banks (see FIG. 3) if 256K dynamic RAM memory integrated circuits are used or 4 memory banks if 64K dynamic RAM integrated circuits are used. The selection of the specific memory bank being accessed is provided by the bank selection decoder circuitry 80. The bank selection decoder circuitry 80 includes a register which contains the number of the memory bank being selected during the CPU access phase. Specifically, the register is addressed by the addresses $C071_{16}$, $C073_{16}$, $C075_{16}$ and $C077_{16}$. The implementation of the addressing for the bank selector decoder circuitry 80 includes a $C07X_{16}$ address decode signal on line 82 provided to the auxiliary card slot from the computer and the least significant byte address 3 and address $\phi$ provided on the memory address lines 96. CAS ENABLE on line 84 and RAS on line 86 together with Q1 on line 94 are used as timing for the bank selection decoder circuitry 80. The actual number of the memory bank is contained in the least significant 4 bits of the memory data input to the bank selection decoder circuitry 80 on line 81. The READ/WRITE- signal on line 92 provides the input indication to the bank selector decode circuitry 80 to input the bank number from the memory data lines 81. The 5v signal on line 88 provides a reset when the power is first turned on.

The output of the bank selection decoder on line 98 is input to memory bank select logic 90 which provides an output on line 78 to the memory access circuitry 70. The memory access circuitry 70 is further connected to timing lines Q1 and Q3 via lines 72 and 76. Additionally, the memory refresh timing circuitry 60 provides an input to the memory access circuitry 70 via lines 74. The memory refresh timing circuitry 60 provides refresh signals to different memory banks at different time intervals to reduce the power requirements of the memory refresh function. The memory refresh timing circuitry 60 receives a VERTICAL COUNTER signal input on line 62, a GRAPHICS MODE ENABLE signal on line 64, a SEGB signal on line 66, and an SEGA signal on line 68. These signals are provided for the display circuitry but are used by the memory refresh timing circuitry 60 to determine the appropriate time intervals to refresh selected memory banks.

Again, it is important to understand that the Applicant's invention effectively adds 16 memory banks to a computer that in its initial state has only 1 memory of the size of any single memory bank. Therefore, the requirement to refresh 16 additional memory banks over and above the 1 memory bank of the computer presents a problem area that is solved by this memory refresh timing circuitry 60 in combination with the memory access circuitry 70.

Lastly, the memory bank 100 includes and address latch 110 connected to the memory address lines 112 with an enabling signal Q3 input on line 108.

Figure 5A:
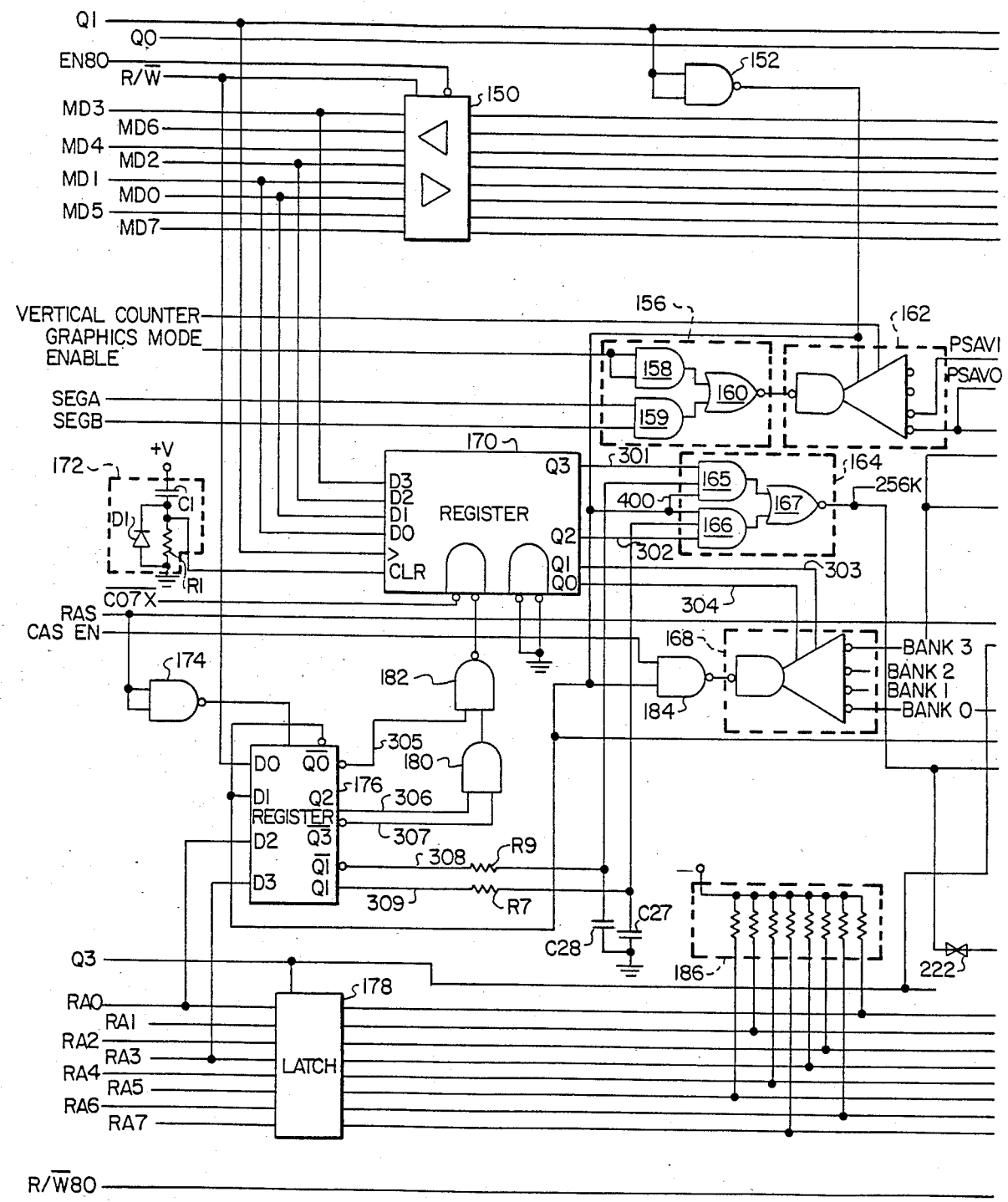
FIGS. 5A and 5B are schematic diagrams of the memory circuit with a first set of memory banks.
Figure 5B:
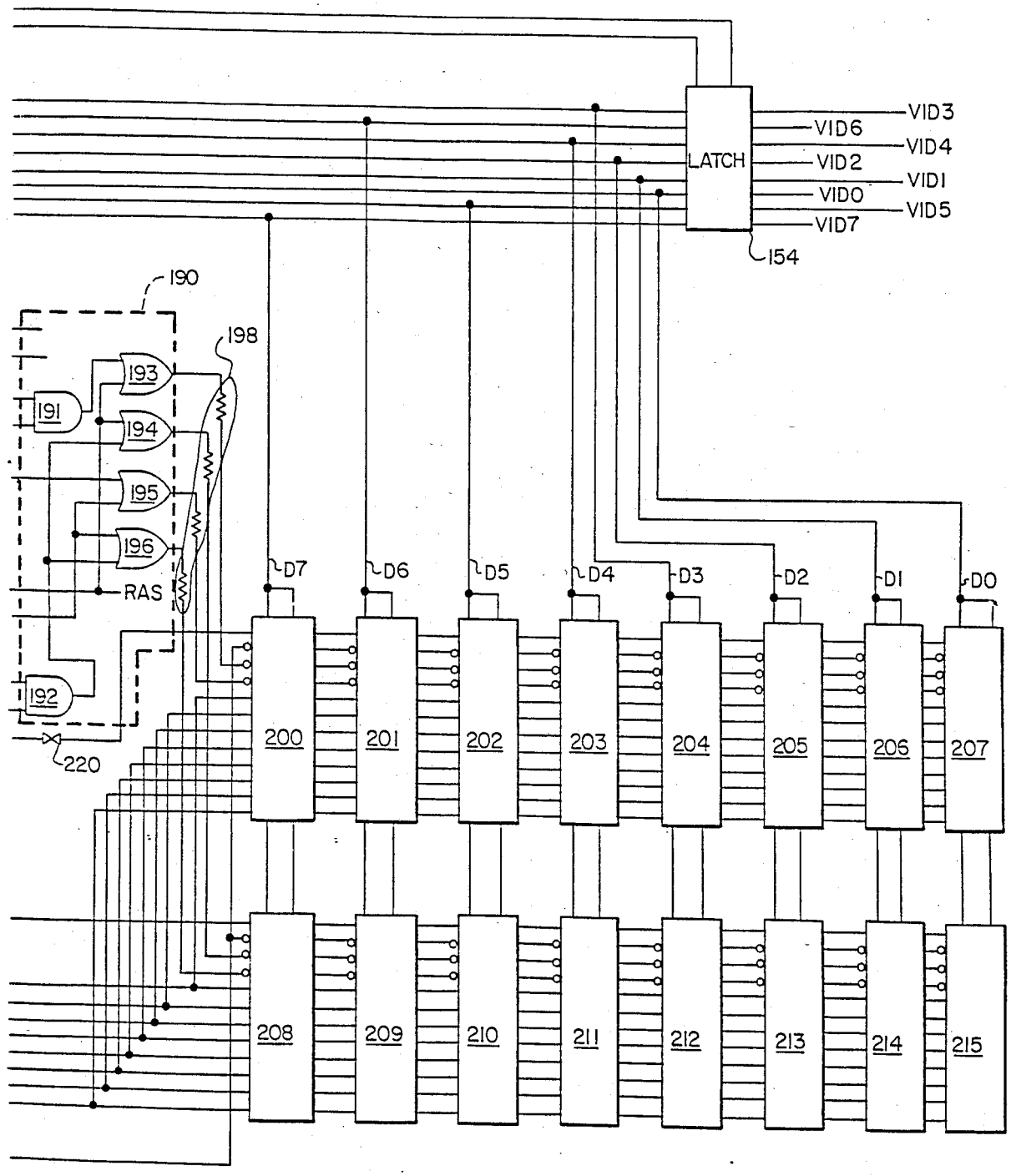
Figure 6:
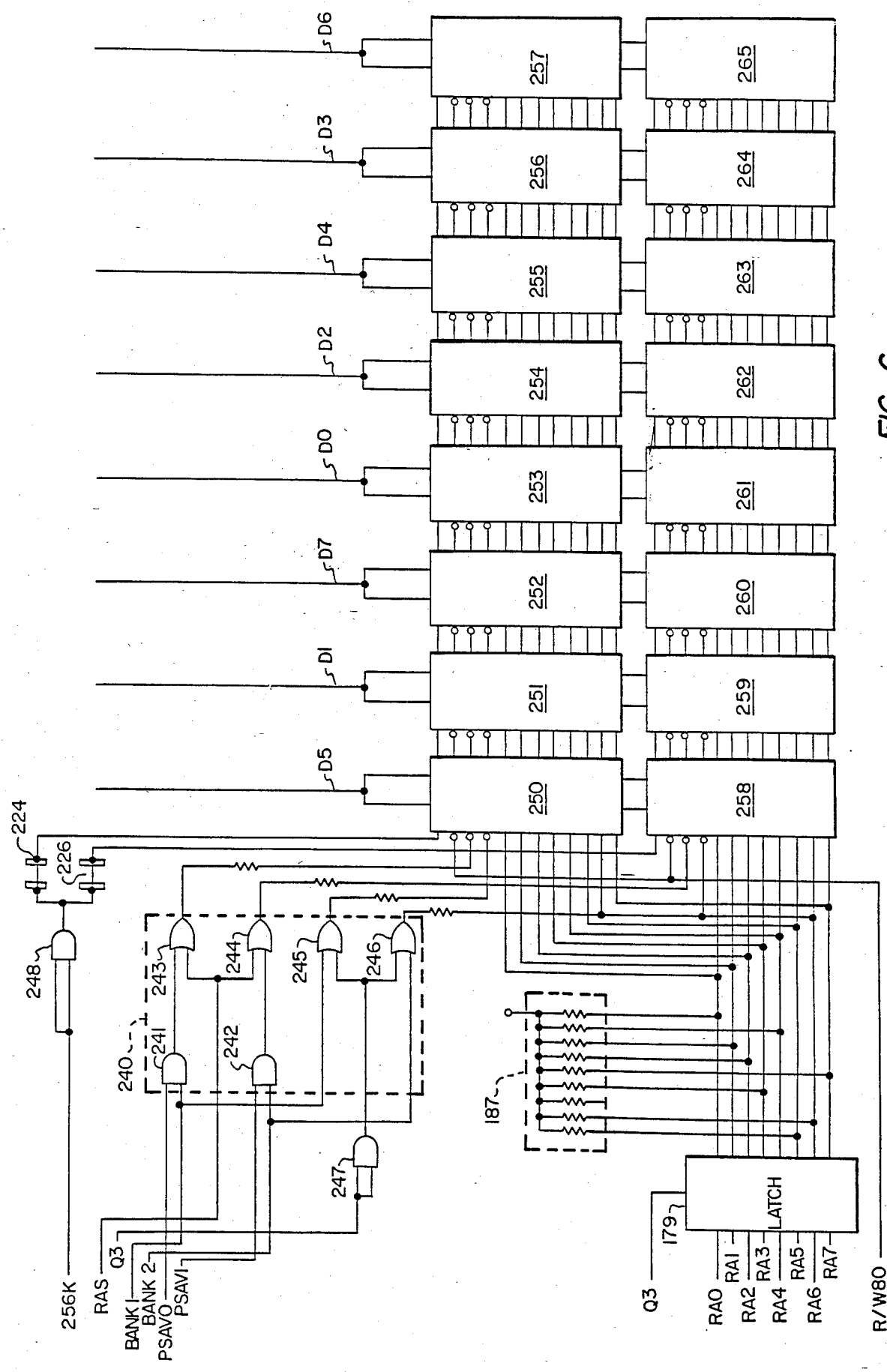
FIG. 6 is a schematic diagram of an extended memory circuit with additional memory banks.

The actual implementation of the Applicant's invention includes two printed circuit boards where one printed circuit board is mounted in a piggyback fashion on a main printed circuit board. The schematic for the main printed circuit board is illustrated in FIGS. 5A and 5B. The schematic for the piggyback printed circuit board is illustrated in FIG. 6.

Referring to FIGS. 5A and 5B, the multiplexed address for the memory is input to the address latch 178 which is clocked by signal Q3. The address lines are shown as RA0-RA7. These address lines are connected to a network of pull up resistors 186 and to two memory banks, the first memory bank being integrated circuits 200 to 207 and the second memory bank being circuits 208 to 215 as shown. Each of the memory banks includes input and output lines that are tied to the individual data lines illustrated as D0-D7. These data lines are connected to a bus 151 that is connected to register 154 on one side and the bidirectional data buffer 150 on the other. The register 154 provides the output to the display circuitry and more specifically signals on lines VID0-VID7 as shown. The memory data to the CPU is provided through the bidirectional buffer 150 on lines MD0-MD7. As stated previously, the direction of the bidirectional buffer 150 is determined by the signal status of the READ/WRITE- line and the bidirectional buffer 150 is enabled by the EN80 signal. The register 154 includes an input enable signal from Q0 and an output enable signal from Q1. Q1 further is connected to a NAND gate 152 that acts as an inverter buffer to provide the Q1— timing signal to the remaining circuitry on the board. In the preferred embodiment, the bidirectional buffer 150 is a 74LS245 and the register 154 is 74LS374.

The bank selection decoder logic includes a register 170, register 176, logic network 164, NAND gate 182 and AND gate 180 together with reset circuit 172. The reset circuit 172 includes an RC network with resistor R1 and capacitor C1 to delay the 5v reset signal to register 170 until stable 5v power is available. Diode D1 is connected to quickly discharge the network during a quick off to on power transition. The data inputs to register 170 (D0-D3) are connected to the Memory Data bus as shown and previously discussed. The register 170 is clocked by Q1. Inputs to the latch are enabled by the external decoding of the address $C07X_{16}$ with the last 4 bits decoded from address lines A0 and A3 through register 176 that provide inputs to AND gate 180 providing the input to NAND gate 182 together with the latched READ/WRITE signal. The 4 bit output of register 170 provides inputs to a logic network 164 and a multiplexer 168. Lines 300 and 301 input to the logic network 164 provide the additional address bit required for 256K DRAMS addressing.

When 64K DRAMS are used this additional address line can be disconnected by breaking a solder connection in the preferred embodiment at locations 220 and 222 as shown. Therefore, logic array 164 is essentially a 1 bit address multiplexer. The output of logic 164 and 168 is forced high and gate 192 is forced low during the video cycle to force access only to bank 0 of the memory bank array in order to provide the appropriate data to the display circuitry as previously discussed. Logic array 164 further includes inputs from register 176 including Q1 and Q1— that pass through RC array of R7, C27 and R9 C28 to guarantee a longer RAS time for address input (see FIG. 2). The output bits are set in register 176 on the falling edge of RAS input through NAND gate 174 and is reset by clearing register 176 during the video cycle via phi 1 phase.

The actual bank selection is accomplished by the decoder 168 that is enabled by the CAS enable signal and Q1— through NAND gate 184. Specifically, decoder 168 receives the least significant 2 bits from register 170 and provides a single bit output for each of the 4 bank select lines, bank 0 through bank 3. The bank 1 and bank 2 signals are used on the piggyback card to be discussed. The bank 0 signal is input into the memory access circuitry 190 and more specifically into AND gate 192 that provides an output to OR gates 194 and 196 to provide the RAS and CAS signals to the resistor network 198 which prevents voltage undershooting, and then to the memory bank circuits 200 through 215. Likewise, the bank 3 signal output from decoder 168 is input into AND gate 191 to provide inputs to OR gates 193 and 195. The memory access circuitry 190 further includes inputs from decoder 162 and logic array 156.

Logic array 156 enables decoder 162 and together they comprise what has been referred to as the memory refresh timing circuitry. As previously discussed, the memory refresh timing of the memory banks is regulated to limit the power requirement and power surge for the required refresh signals for up to 16 memory banks. Specifically, signals SEGA, SEGB and the GRAPHICS MODE ENABLE are input to the logic array 156 to provide an enable to the decoder 162. The actual RAM refreshing is accomplished by the RAS signal via PSAV0 and PSAV1. Since the video refresh occurs eight times more often than is necessary to keep the RAM refreshed, PSAV0 and PSAV1 are true as infrequently as possible in order to conserve power.

The SEGA, SEGB and VC lines are used by the logic array 156 to detect one out of eight redundant video refresh times. SEGA and SEGB are invalid during the graphics modes as determined by the signal GR, so half of the video cycles cause refresh instead of one eighth in the graphics mode. The logic array 156 detects one of four cases by ANDing SGA and SGB when the graphics mode is enabled. The output of the logic array 156 enables the decoder 162 which further decodes Q1— and the VERTICAL COUNTER signal. The VERTICAL COUNTER input causes the decoder 162 output PSAV0 and PSAV1 to appear out of phase so that at most two banks get refreshed simultaneously and thus reducing any peak power. The output PSAV0 is provided to the memory access circuitry 190 as an input to AND gate 191. Both PSAV0 and PSAV1 are also provided as inputs to the piggyback circuit to be discussed.

The schematic diagram for the piggyback board is illustrated in FIG. 6. The 256K address signal is input to a AND gate 248 that serves as a driver to drive signals through breakable connections 224 and 226 to the eight banks of memory provided and illustrated as two banks of memory circuits 250 to 257 and 258 to 265 respectively. The piggyback board further includes memory access circuitry 240. This memory access circuitry 240 receives the PSAV0, PSAV1, BANK 1 and BANK 2 signals from the main board together with the RAS signal and Q3 for timing. PSAV0 and BANK 1 are provided as inputs to AND gate 241 and PSAV1 and BANK 2 are provided as inputs to AND gate 242. The outputs of AND gates 241 and 242 are input to OR gates 243 and 244 respectively with the RAS signal. The outputs of OR gates 243 and 244 are the RAS signals for the two memory banks 250 to 257 and 258 to 265 which are coupled through two of the four resistors and the network 199. Likewise, the CAS signal is provided by BANK 1 and BANK 2 signals that are input with Q3 provided through an AND gate 247 as a driver to produce CAS signals as outputs of the OR gates 245 and 246 through the same resistor network 199 to the two memory banks 250 to 257 and 258 to 265. As before, the address for these two memory banks are provided through a register 179 that is clocked by timing signal Q3. The output of the register 179 includes connections to a pull up resistor network 187. The data output of the memory banks, D0 through D7, are connected in the piggyback connection to the D0 through D7 Memory Bus of the main board illustrated in FIGS. 5A and 5B.

It is recommended that in using the computer that the computer be initialized by initializing the bank register to 0. In addition, to handle interrupts it must be understood that a memory bank that is switched into operation during the CPU cycle contains the total address space of the CPU and thus any interrupt routines that are used must be stored in each memory bank to process interrupts. Another alternative is, of course, to lock out the interrupts whenever an auxiliary memory is used.

It should be understood that when 64K DRAMS are used, two banks are available on the main card and two banks are available on the piggyback card and are selected by the bank 0, bank 1, bank 2 and bank 3 signals respectively. If 256K DRAMS are used bank 0 becomes banks 0, 4, 8, and 12; bank 1 becomes banks 1, 5, 9 and 13; bank 2 becomes banks 2, 4, 6, 14 and bank 3 becomes banks 3, 7, 11 and 15.

Although preferred embodiments of the invention have been described in detail, it should be understood that various changes, alterations and substitutions may be made therein without departing from the scope and spirit of the invention as defined by the appended claims.

What is claimed is:

1. A memory circuit for interconnection to a data processor having a central processing unit, said memory circuit being adapted to add additional memory storage to said data processor comprising in combination:
   a plurality of memory banks, each bank including memory means for storage of information;
   a bank selection circuit means connected to said central processing unit for receiving information from the data processor indicating a selected one of the memory banks, and responsive to a timing signal generated by said central processing unit responsive to the operating sequence of said central processing unit; and
   memory access means for alternating access between the selected memory bank and a specific memory bank.

2. A memory circuit according to claim 1 further including memory refresh means for providing only one refresh signal to each memory bank during a single refresh time period, said refresh time period including a plurality of time intervals during which at least one memory bank receives a refresh signal.

3. A memory circuit according to claim 2 wherein said memory access means provides data from said specific memory bank on a dedicated output path.

4. A memory circuit according to claim 3 wherein each memory means of each memory bank includes a memory location for each memory address of the data processor.

5. A memory circuit according to claim 4 wherein said memory refresh means generates the refresh signal in accordance with a plurality of signals from a display means.

6. A memory circuit according to claim 5 wherein the specific memory bank contains information storage locations dedicated for access by said display means.

7. A memory circuit for interconnection with a data processor, to externally add additionally memory storage useable by said data processor and under control of said data processor and wherein said data processor generates at least one timing signal responsive to the timing sequence of the operation of said data processor, said memory circuit comprising:
   a plurality of memory banks, each memory bank including memory means for storage of information for said data processor;
   a bank selection circuit connected to the data processor for receiving data representing a selected one of said plurality of memory banks; and
   memory access means for alternating access between the selected memory bank and a specific memory bank in accordance with said timing signal from said data processor.

8. A memory circuit according to claim 7 wherein said specific memory bank includes information storage for a dedicated application circuit of said data processor.

9. A memory circuit according to claim 8 wherein said dedicated application circuit is a display means for providing the output of information to a data processor user.

10. A memory circuit according to claim 9 wherein said timing signal indicates access of the memory circuit by the dedicated application circuit.

11. A memory circuit according to claim 10 wherein said timing signal indicates a access of the memory circuit by the display means.

12. A memory circuit according to claim 1 further including memory refresh means for providing a refresh signal to said memory banks in accordance with a plurality of signals from the display means.

13. A memory circuit for interconnection with a data processor to externally add memory storage useable by said data processor under control of said data and wherein said data processor generates at least one timing signal responsive to the sequence of operation of the data processor, said memory circuit comprising:

data interface means for transmitting and receiving data information from said data processor;

address interface means for transmitting and receiving address information from the data processor;

a plurality of memory banks, each bank including memory means for storage of information and each connected to said data interface means and said address interface means;

memory banks selection means for receiving at least one signal from said data processor indicating a selected memory bank for access;

memory access means for providing access signals to the plurality of memory banks providing access to the stored information in response to control signals received from said data processor, said access means alternating access between the selected memory bank and a specific memory bank in response to said timing signal from said data processor indicating a memory access by a dedicated circuit; and memory refresh means for providing a single refresh signal to each memory bank during a refresh time period which consists of a plurality of individual time intervals where during each interval at least one memory bank receives its refresh signal.

14. A memory circuit according to claim 13 wherein each memory means includes a memory location for each address location of the data processor.

15. A memory circuit according to claim 14 wherein said memory refresh means provides the refresh signal in response to a plurality of signals from said dedicated circuit.

16. A memory circuit according to claim 15 further including an output interface means for transmitting the stored information of the memory means to the dedicated circuit.

17. A memory circuit according to claim 16 wherein said specific memory bank includes memory locations dedicated to the storage of information for the dedicated circuit.

18. A memory circuit according to claim 17 wherein said dedicated circuit is a memory means for the display of output information to a user.

19. A memory circuit according to claim 18 further including a reset circuit means connected to receive a power signal from the data processor and for providing a reset signal to the memory circuit for initializing the memory circuit at a delayed time interval after the reception of the power signal.

20. A method of adding additional memory storage capacity externally to a data processor, including a central processing unit and video display circuitry comprising the steps of:

providing a plurality of memory banks externally of said data processor;

providing for access from each of said central processing unit and said video display circuitry to said plurality of memory banks for the transfer of data therebetween;

utilizing a timing signal from said data processor to selectively access said memory banks from one said central processing unit and said video display circuitry for alternating access between various memory banks;

specifying at least one of said memory banks to store video display information from said video display circuitry as required by said data processor;

utilizing the remaining memory banks for the general storage of information from said data processor; and accessing the specified video display information memory bank during a time interval when said central processing unit is not accessing said memory bank.

* * * * *